US005652540A

United States Patent [19]
Eilley

[11] Patent Number: 5,652,540
[45] Date of Patent: Jul. 29, 1997

[54] CURRENT SENSING CIRCUIT HAVING AT LEAST ONE SENSE CELL

[75] Inventor: Edward Stretton Eilley, Reigate, England

[73] Assignee: U S Philips Corporation, New York, N.Y.

[21] Appl. No.: 567,732

[22] Filed: Dec. 5, 1995

Related U.S. Application Data

[63] Continuation of Ser. No. 142,626, Oct. 25, 1993, abandoned.

[30] Foreign Application Priority Data

Oct. 26, 1992 [GB] United Kingdom ................... 9222455

[51] Int. Cl.⁶ ................................................ H03K 5/24
[52] U.S. Cl. ................... 327/565; 327/77; 327/88
[58] Field of Search ..................... 307/296.6, 296.8, 307/360, 362, 356, 350, 358, 303, 303.2; 327/58, 62, 63, 68, 70, 72, 74, 77, 78, 79, 80, 81, 83, 88, 89

[56] References Cited

U.S. PATENT DOCUMENTS

| | | | |
|---|---|---|---|
| 4,524,351 | 6/1985 | Kimura et al. | 307/358 |
| 4,775,807 | 10/1988 | Bukowski, Jr. | 327/72 |
| 4,825,104 | 4/1989 | Yamakoshi et al. | 327/63 |
| 4,901,127 | 2/1990 | Chow et al. | 307/570 |
| 4,948,994 | 8/1990 | Akioka et al. | 307/579 |
| 4,990,978 | 2/1991 | Kondoh | 357/23.4 |
| 5,079,456 | 1/1992 | Kotowski et al. | 307/568 |
| 5,107,151 | 4/1992 | Cambier | 307/570 |
| 5,113,089 | 5/1992 | Osawa | 307/362 |
| 5,180,929 | 1/1993 | Kokubun | 327/77 |
| 5,220,207 | 6/1993 | Kovalcik et al. | 307/491 |
| 5,304,865 | 4/1994 | Schoofs | 307/354 |

FOREIGN PATENT DOCUMENTS 0390485   10/1990   European Pat. Off. .

*Primary Examiner*—Timothy P. Callahan
*Assistant Examiner*—T. Lam
*Attorney, Agent, or Firm*—Steven R. Biren

[57] ABSTRACT

A power semiconductor device (4) has a main current carrying section (4a) with a number of parallel-connected active device cells (5) and a first main electrode (6) coupled to a first terminal (2), a second main electrode (7) connected to a second terminal (3) and a control electrode (8) and a sense current carrying section (4b) with at least one sense cell (5a) similar to the active device cells (5) and having a first main electrode (6) coupled to the first terminals (2) and a second main electrode (9). A current sensing arrangement (10) has a first resistor (R1) coupling the second main electrode (9) of the sense current carrying section (4b) to the second terminal (3), a second resistor (R2) similar to the first resistor (R1) and a current source (11) coupled in series with the second resistor to the second terminal (3) for supplying a reference current (Ir) through the second resistor (R2). A comparator (12) compares the voltages across the first and second resistors (R1 and R2) to provide an output signal (0) to indicate when the current through the main current carrying section (4a) reaches a predetermined value.

13 Claims, 1 Drawing Sheet

CURRENT SENSING CIRCUIT HAVING AT LEAST ONE SENSE CELL

This is a continuation of application Ser. No. 08/142,626, filed on Oct. 25, 1993, now abandoned.

BACKGROUND OF THE INVENTION

This invention relates to a current sensing circuit, in particular a current sensing circuit for sensing the current through a power semiconductor device such as an insulated gate bipolar transistor (IGBT).

U.S. Pat. No. 4,990,978 and EP-A-390485 describe current sensing circuits each of which has first and second terminals and comprises a power semiconductor device having a main current carrying section consisting of a number of parallel-connected active device cells with first and second main electrodes coupled to the first and second terminals, respectively, of the circuit and a control electrode and a sense current carrying section comprising at least one sense cell similar to the device cells and having a first main electrode coupled to the first terminal and a second main electrode, and a current sensing arrangement comprising a first resistor coupling the second main electrode of the sense current carrying section to the second power supply line.

In these circuits, the current through the sense current carrying section follows that through the main current carrying section and the voltage across the first resistor produced by the current through the sense current carrying section may be compared with a reference voltage provided by for example a band gap reference generator to provide an indication when a given current level is reached. However such circuits present problems in that any variation in the absolute value of the resistance of the first resistor, or variations in temperature which may affect its resistance, will of course affect the voltage sensed for a given current. Accordingly there may be variations between different processing batches or variations due to external effects such as temperature changes.

SUMMARY OF THE INVENTION

It is an aim of the present invention to provide a current sensing circuit in which the above mentioned problems are avoided or at least mitigated.

According to the present invention, there is provided a current sensing circuit having first and second terminals and comprising a power semiconductor device with a main current carrying section comprising a number of parallel-connected active device cells and having a first main electrode coupled to the first terminal, a second main electrode coupled to the second terminal and a control electrode and a sense current carrying section comprising at least one sense cell similar to the active device cells and having a first main electrode coupled to the first terminal and a second main electrode, and a current sensing arrangement comprising a first resistor coupling the second main electrode of the sense current carrying section to the second terminal, characterized in that the current sensing arrangement further comprises a second resistor similar to the first resistor, a current source coupled in series with the second resistor to the second terminal for supplying a reference current through the second resistor and a comparator for comparing the voltages across the first and second resistors and for providing an output signal to indicate when the current through the main current carrying section reaches a predetermined value.

Thus, in a circuit in accordance with the invention, the voltage or potential across the first resistor is compared with the voltage produced by a reference current across a second resistor which is similar to the first resistor, that is which is produced using the same process technology and generally at the same time as the first resistor. Accordingly, the ratio between the resistances of the first and second resistors can be very closely predictable and their absolute values are no longer of significance so that process variations affecting both resistors will not affect the predetermined value at which the comparator provides an output signal nor will changes in the ambient temperature. Under absolutely ideal conditions, the first and second resistors may have identical values of resistance. Generally, however, the first and second resistors will be in a predetermined ratio which should be quite small as process variations between the resistors may increase with the increase in the difference in values. Typically, the ratio between the first and second resistors may be 1:10 or less. The comparator thus directly relates the current through the device, as represented by the sense current, to the reference current. In addition, the predetermined value at which the comparator provides an output signal is determined by the reference current and, although the reference current source could be formed integrally with the power semiconductor device, preferably it is formed externally of the power semiconductor device which enables the reference current to be adjusted or trimmed to meet or cope with minor variations in the specification of the circuit or end use, or to be changed significantly for a new use. Typically, the reference current source may be a fixed value resistor connected to a constant voltage source which may be a voltage source already available for the power semiconductor or could be derived in any suitable known manner, for example by using one or more zener diodes to define the voltage. As a possible alternative a fixed current source could be derived in known manner using active devices. In addition, the current source may be designed to provide different reference currents under control of a suitable control system to allow, for example, for a higher current under certain specific conditions as may occur in cold weather conditions where the power semiconductor device is being used in an automotive ignition system.

The output signal of the comparator may be used as an input signal for any suitable form of system control for the power semiconductor device. For example, the output signal may be used to switch off the power semiconductor device when an overload causes an excessive current. The circuit may thus be used for current limiting and should assist in inhibiting problems such as avalanche breakdown which might otherwise occur if the current became too high. The circuit could also be used to detect an undercurrent as may for example occur if the load connected to the power semiconductor device becomes open-circuited. Indeed, the same circuit may be used to detect both overcurrents and undercurrents by providing two separate current sources providing two different reference currents and by comparing the sensed current separately with each reference current.

The second main electrode of the power semiconductor device may be coupled to the second terminal by a third resistor similar to the first and second resistors.

Although the resistors could be separately formed from the power semiconductor device, preferably the resistors comprise semiconductor resistors carried by a semiconductor body within which the active device cells are formed. The resistors may comprise semiconductor resistors, for example thin-film, e.g. doped polycrystalline silicon, resistors provided on top of and insulated from the power semiconductor device. This allows the resistors to be integrated with the power semiconductor device but avoids problems such as parasitive bipolar action which may arise if diffused resistors are used. As one possible alternative, where parasitive bipolar action is not a problem or can be avoided, the resistors may be formed by diffused regions within the semiconductor body of the power semiconductor device.

The power semiconductor device may comprise a semiconductor body within which the active device cells comprise an insulated gate bipolar transistor with each device cell comprising, within a common drift region of one conductivity type, a body region of the opposite conductivity type and an emitter region of the one conductivity type separated from the common drift region and shorted to the second main electrode by the body region which defines a conduction channel area adjacent which is provided an insulated gate to form the control electrode for providing a gateable conductive path for charge carriers of the one conductivity type between the emitter region and the common drift region with at least one injector region contacting the first main electrode for injecting charge carriers of the opposite conductivity type into the common drift region.

In such a case, the at least one sense cell may comprise a body region similar to the body regions of the active device cell and formed within the common drift region but from which the emitter region has been omitted and with the second main electrode of the sense current carrying section contacting the body region of the at least one sense cell and the first main electrode of the sense carrying section being provided by the first main electrode of the main current carrying section. Such an arrangement has advantages in that, because the sense current carrying section is formed only by a bipolar component (the pup transistor in the case of an N channel IGBT), it does not include the internal resistance of the MOS component and provides a good current source. Moreover, the sense current section is not constrained to the source (emitter) voltage of the IGBT and is not affected by changes in the I-V characteristics of the IGBT such as may occur when the IGBT is being used in an automotive ignition system and the IGBT moves from a state in which the MOS part of the structure is in the linear region to an active state in which the MOS part of the IGBT is saturated.

The sense current carrying section could consist of one or more cells identical to the active device cells although in such circumstances the problems mentioned above with respect to the effect of the MOS component internal resistance and the fact that the sense current carrying section would be tied to the IGBT source (emitter) voltage would arise. In such circumstances, a third resistor may be connected between the second main electrode of the IGBT and the second terminal so as to enable the voltage across the sense current carrying section to follow that across the main current carrying section more closely at the expense of increasing the voltage across the device.

The power semiconductor device could be a power MOSFET rather than an IGBT or even a bipolar transistor, although in each case it would probably be desirable for the third resistor mentioned above to be provided because of the fact that the sense cells would generally be identical to the active device cells and the sense current section would be tied to the source (emitter) voltage of the main current carrying section.

The power semiconductor device may be vertical device with the first and second main electrodes of the main current carrying section being provided at opposed major surfaces of the semiconductor body.

BRIEF DESCRIPTION OF THE DRAWING

Embodiments of the invention will now be described by way of example with reference to the accompanying drawing, in which.

It should of course be appreciated that the Figures are not to scale and that, especially with regard to FIG. 2, certain dimensions such as the thickness of layers or regions may have been exaggerated in the interests of clarity. Like reference numerals are used throughout to refer to like parts.

DESCRIPTION OF THE PREFERRED EMBODIMENTS

Figure 1:
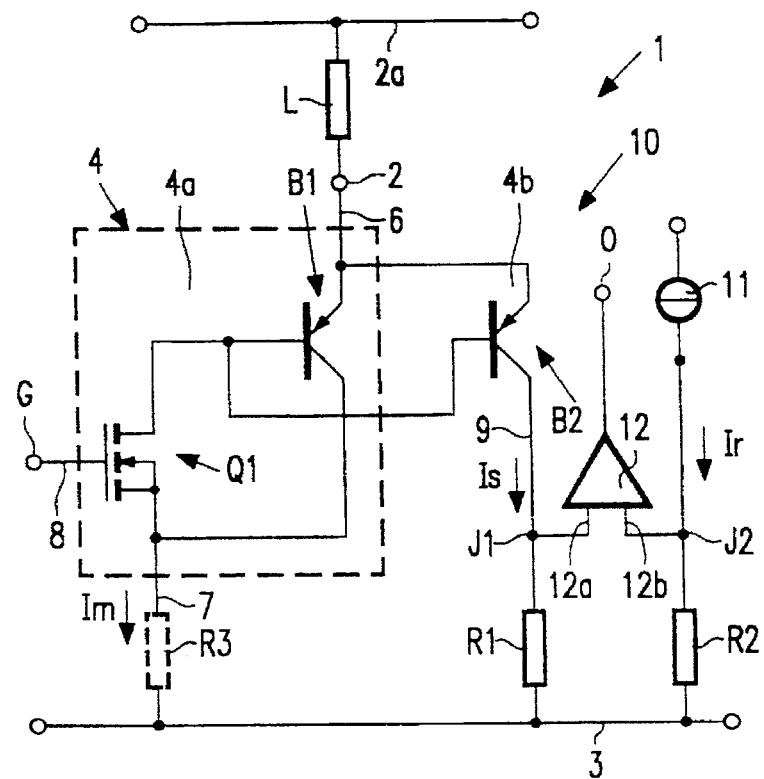
FIG. 1 is a circuit diagram of a circuit in accordance with the invention which shows a power semiconductor device by its equivalent circuit and also schematically shows a load.

Referring now to the drawing, there is illustrated a current sensing circuit 1 having first and second terminals 2 and 3 and comprising a power semiconductor device 4 with a main current carrying section 4a comprising a number of parallel-connected active device cells 5 and having a first main electrode 6 coupled to the first terminal 2, a second main electrode 7 coupled to the second terminal 3 and a control electrode 8 and a sense current carrying section 4b comprising at least one sense cell 5a similar to the active device cells 5 and having a first main electrode 6 coupled to the first terminal 2 and a second main electrode 9, and a current sensing arrangement 10 comprising a first resistor R1 coupling the second main electrode 9 of the sense current carrying section 4b to the second terminal 3. In accordance with the invention, the current sensing arrangement 10 further comprises a second resistor R2 similar to the first resistor R1, a current source 11 coupled in series with the second resistor R2 to the second terminal 3 for supplying a reference current Ir through the second resistor R2 and a comparator 12 for comparing the voltages across the first and second resistors R1 and R2 and for providing an output signal 0 to indicate when the current through the main current carrying section 4a reaches a predetermined value.

In a circuit in accordance with the invention, the voltage or potential across the first resistor R1 is compared with the voltage produced by the reference current Ir across the second resistor R2. The second resistor R2 is similar to the first resistor R1, that is the second resistor R2 is produced using the same process technology and generally at the same time as the first resistor R1. Accordingly, the ratio between the resistances of the first and second resistors R1 and R2 is very closely predictable and their absolute value are not of significance so that neither process variations effecting both resistors nor changes in ambient temperature will affect the predetermined value at which the comparator provides an output signal. The comparator 12 thus directly relates the current Im through the device, as represented by the sense current Is, to the reference current Ir. The predetermined value at which the comparator 12 provides an output signal 0 is determined by the reference current Ir.

Figure 2:
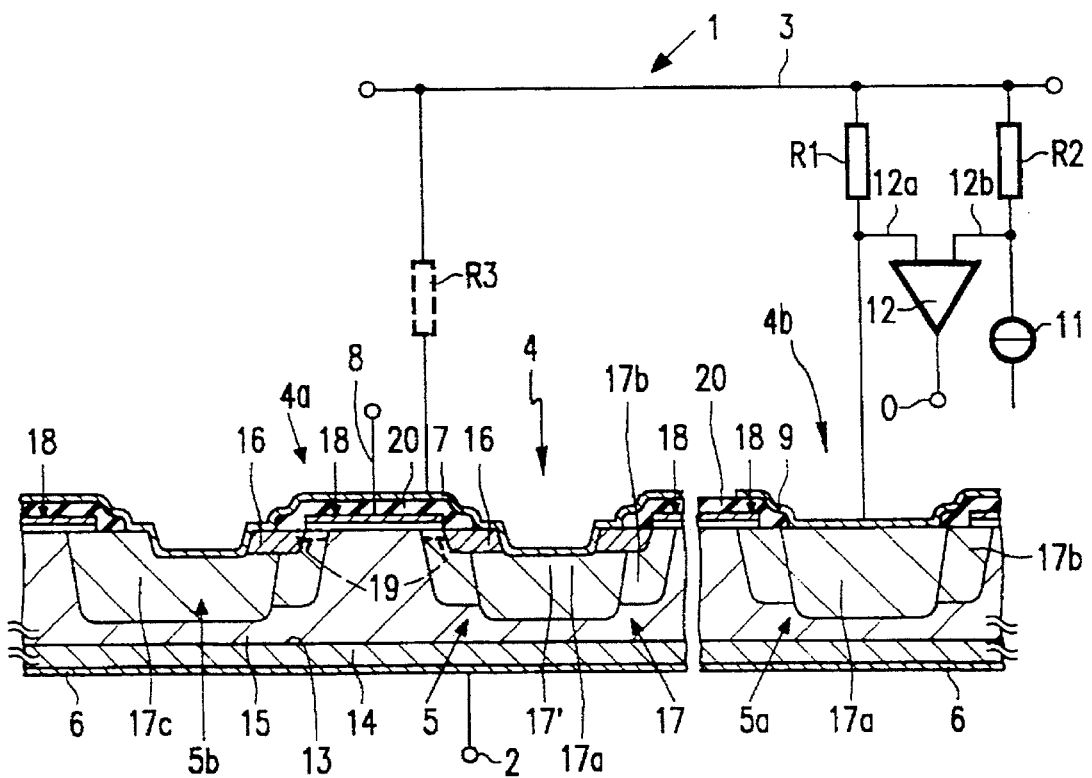
FIG. 2 is a schematic block diagram of a circuit in accordance with the invention showing part of the power semiconductor device of FIG. 1 in cross-section.

In the example illustrated by FIGS. 1 and 2, the power semiconductor device 4 is an n channel insulated gate bipolar transistor (IGBT). In the circuit diagram shown in FIG. 1, the IGBT 4 is not illustrated by its conventional circuit symbol but is illustrated by a combination of insulated gate field effect transistor and bipolar transistor circuit symbols so as to illustrate the functioning of the device. Thus, in FIG. 1, the main current carrying section 4a is delimited by the phantom lines and is illustrated as an n channel enhancement mode insulated gate field effect transistor Q1 in combination with a pnp bipolar transistor B1. The transistor Q1 has its source coupled to the second main electrode 7 of the IGBT 4. This second main electrode 7 is normally identified as the emitter or cathode C of an n-channel IGBT. The emitter electrode 7 is itself coupled to the second terminal 3 (possibly via an optional resistor R3 shown in phantom lines in FIG. 1). The drain of the transistor Q1 is coupled to the base of the bipolar transistor B1. The emitter of the pnp bipolar transistor B1 is coupled to the first main electrode 6 of the IGBT. This first main electrode 6 is normally known as the anode electrode A of an n-channel IGBT. The collector of the bipolar transistor B1 is coupled to the back gate of the transistor Q1 and thus, by virtue of the normal back-gate source short, to the source of the transistor Q1. The insulated gate of the transistor Q1 provides the control electrode 8 of the IGBT.

For reasons which will become clear from the following description, the sense current carrying section 4b is illustrated merely by a pnp bipolar transistor B2 having its base and emitter connected to the base and emitter, respectively, of the bipolar transistor B1. The collector of the bipolar transistor B2 provides the second main electrode 9 of the sense current carrying section 4b and is coupled to the second terminal 3 via the first resistor R1.

The junction J1 between the resistor R1 and the second main electrode 9 of the sense current carrying section 4b is coupled to one input 12a of the comparator 12 with the other input 12b of the comparator 12 being coupled at a junction J2 to the second terminal 3 via the second resistor R2. As indicated above, a reference current Ir for the second resistor R2 is supplied by a reference current source 11. Although in this example, the reference current source 11 is coupled to the second terminal 3 via the second resistor R2, it will be appreciated by those skilled in the art that the locations of these two components could be reversed.

The comparator 12 may be of any suitable conventional type, for example a high gain differential amplifier formed by insulated gate field effect transistors which may be integrated with the power semiconductor device in a known manner. Although the reference current source 11 could be formed integrally with the power semiconductor device 4, preferably it is formed externally of the power semiconductor device 4 which enables the reference current Ir to be adjusted or trimmed to cope with minor variations in the specification of the circuit or end use or to be changed significantly for a new use. The reference current source 11 may be a fixed value resistor, with a value selected, for example, in the range of from 1 to 5 kilo-ohms, coupled to a constant voltage source which may be a voltage source already available for the power semiconductor 4 or could be derived from a suitable power supply in any suitable known manner, for example by using one or more zener diodes to define the voltage. As a possible alternative a fixed current source could be derived in known manner using active devices. In addition, the current source 11 may be designed to provide different reference currents under control of a suitable control system to allow, for example, for a higher current under certain specific conditions as may occur in cold weather conditions where the power semiconductor device is being used in an automotive ignition system.

FIG. 2 is a schematic diagram of the circuit shown in FIG. 1 with part of the IGBT 4 shown in cross-section to show typical examples of structures for the active device cells 5 and the sense cell 5a. The cross-section of FIG. 2 is through a part of the semiconductor adjacent its periphery and so shows one of the many parallel-connected normal active device cell 5 and a peripheral device cell 5b.

The IGBT has a semiconductor body 13 comprising a relatively highly doped monocrystalline, typically silicon, substrate 14 on which is provided a relatively lowly doped epitaxial layer 15. Where, as in this example, the power semiconductor 4 is an IGBT then the substrate 14 will form the anode region and be of the opposite conductivity type, p conductivity type in this example, to the epitaxial layer 15 which forms a common drift region. Although not shown, in the case of an IGBT structure, discrete regions of the one conductivity type, n conductivity type in this example, may extend through the substrate 14 to provide an anode-shorted structure. The first main electrode 6 is provided in ohmic contact with the substrate 14.

In this example, the power semiconductor device 4 is of the DMOS type with each active device cell 5 comprising a respective source region 16 of the one conductivity type formed in the common drift region 15 and separated from the common drift region 15 by an associated conduction channel region-defining body region 17 of the opposite conductivity type. The source and body regions 16 and 17 are auto-aligned to an insulated gate structure 18 in known manner so that a conduction channel region 19 of each body region 17 underlies a respective part of the insulated gate structure 18. Generally the insulated gate structure 18 comprises a thermal oxide layer on which is provided a doped polycrystalline silicon layer.

As will be appreciated by those skilled in the art, if FIGS. 1 and 2 are compared then the p conductivity type substrate 14 forms the anode of the IGBT and the source regions 16 form the cathode of the IGBT 4. FIG. 1 shows the IGBT 4 as the combination of an NMOS transistor Q1 and bipolar transistors B1 and B2. In respect of the main current-carrying section 4a of the IGBT then the source, back gate and drain of the NMOS transistor Q1 shown in FIG. 1 are formed by the source regions 16, body regions 17 and common drift region 15, respectively, while the collector, base and emitter of the pnp bipolar transistor B1 are formed by the body regions 17, the common drift region 13 and the substrate 14, respectively.

In the example illustrated in FIG. 2, each body region 17 has a relatively highly doped relatively deep subsidiary region 17a formed by use of an appropriate mask before definition of the insulated gate structure 18. Although not shown, each body region 17 may also have a further relatively highly-doped subsidiary region which is formed by introduction of impurities after definition of the insulated gate structure 18 but while the photosensitive resist mask (not shown) used to define the insulated gate structure 10 is still in place so that the further relatively highly doped subsidiary region is aligned to the mask but slightly spaced from the edge of the insulated gate structure 18 due to underetching during definition of the insulated gate structure.

Each body region 17 has a relatively lowly-doped subsidiary region 17b which, like the source region 16, is formed by introduction of impurities after definition of the insulated gate structure 18 so as to be aligned to the insulated gate structure 18.

The peripheral device cells 5b are similar to the remaining active device cells 5 except that the source regions 16 are omitted (or overdoped) from the outer part of the cell and the outer periphery of the cell is formed by a relatively deep relatively high doped p conductivity region 17c.

An insulating layer 20 is provided over the insulated gate structure 18 and then windows opened to enable subsequent metallisation to provide a gate electrode (not shown) contacting the insulated gate structure 18 and the second main electrode 7 contacting the emitter regions 16. The second main electrode 7 also electrically shorts the body regions 17 to the source regions 16. In the examples illustrated this is achieved by etching a moat, using conventional photolithographic and etching processes, through the centers of the source regions 16 to expose a central area 17 of the body regions 17.

The power semiconductor device will have, typically, many thousands of active device cells 5, surrounded by peripheral active device cells 5b, which are connected in parallel by means of the first and second main electrode 6 and 7 and the insulated gate electrode 8.

Although not shown in FIG. 2, generally the outer periphery (as defined by the peripheral device cells 5b) of the semiconductor device will, as is well known in the art, be surrounded by some form of edge termination, for example field relief (Kao's) rings and/or field plates.

In this example, the sense current carrying section 4b is formed by one or more device cells 5a which are similar to the active device cells 5 but from which the source regions 16 have been omitted. Although FIG. 2 shows only one such sense cell 5a the actual IGBT 4 may have several such sense cells 5a. The first main electrode of the sense current carrying section 4b is formed integrally with the first main or anode electrode 6 of the main current carrying section 4a while the second main electrode 9 of the sense current carrying section is formed with but separated from the second main or cathode electrode 7 of the main current carrying section 4a so as to contact the body regions 17a of the sense cells 5a.

Although not shown, the first and second resistors R1 and R2 (and the third resistor R3 if present) are preferably carried by the semiconductor body 13. Thus, for example, the resistors R1 and R2 (and R3 if present) may be formed using thin film technology, generally doped polycrystalline silicon, on top of an insulating layer provided on the power semiconductor device 4 or as a possible alternative, if parasitic bipolar action is not a problem or can be avoided, could be formed as diffused regions within the semiconductor body 13. As another alternative, the resistors could be external components.

The sense cells 5a could be identical in structure to the active device cells 5 as described in for example U.S. Pat. No. 4,783,690, however the omission of the IGBT source or emitter regions 16 as described in, for example, U.S. Pat. No. 4,990,978 may have advantages. Thus, where the sense cells have an identical structure to the active device cells and should therefore carry a current Is which is a representative fraction of the total IGBT current, the fact that the potential across the sense cells is no longer the same as that of the main current carrying section makes such an arrangement less accurate than it should be. This problem can be alleviated by including the first resistor R1 in only the collector circuit of the pnp transistor component of the IGBT because, provided the potential across the first resistor R1 is small, eg not more than two or three hundred millivolts, the collector provides a good current source and the measure of the bipolar portion of the current, which should follow the overall current, will be quite accurate. The pnp transistor of the sense cell 5a remains closely linked to the active device cells 5 and so still provides a good indication of the total device current Im. This could be achieved merely by not contacting the source regions 16 of the sense cells 5a. However the omission of these source regions 16 from the sense cells 5a has advantages in that it should help avoid the increased likelihood of parasitic bipolar action because of the increase in the gain of the inherent thyristor caused by the inclusion of the first resistor R1.

Under absolutely ideal conditions, the first and second resistors R1 and R2 may have identical values of resistance. Generally, however, the first and second resistors R1 and R2 will be in a predetermined ratio which should be quite small as process variations between the resistors may increase with the increase in the difference in values. Typically the ratio between the first and second resistors R1:R2 may be 1:10 or less. For a conventional IGBT with 10000 typically active device cells, the first resistor R1 may have a value of 15 Ω (Ohms) while the second resistor R2 may have a value of 50 Ohms.

In operation of the circuit shown in FIG. 1, the terminal 2 is generally coupled via a load L to a positive voltage supply line 2a and the second terminal 3 generally forms the other power supply line 2 and is usually coupled to ground although any suitable voltage below that of the positive voltage power supply line 2a could be used. In order to render the IGBT conducting the control electrode 8 is coupled at the terminal G to a suitable positive voltage. The reference current source 11 provides a reference current Ir through the second resistor R2 to establish thereacross a voltage at junction J2 which is compared by the comparator 12 with a voltage at junction J1 established across the first resistor R1 by the current Is through the sense current section 4b. The reference current Ir is selected such that, when the current through the IGBT main current carrying section 4a exceeds a maximum desirable value, due for example to the behavior of the load L which may be an inductive load such as automotive ignition coil, the comparator 12 provides an output signal 0 which can be supplied to a control circuit (not shown) which then acts to switch off the IGBT 4. The control circuit could simply consist of an active device such as, in this example, a lateral NMOS transistor, having its main current path connected between the gate 8 and cathode 7 electrodes of the IGBT 4 and its control electrode connected to the output of the comparator 12 so that the output signal 0 of the comparator 12 switches on the transistor, causing the current through the IGBT to be held at a threshold level determined by the sense current Is signal, the reference current Ir and the comparator 12. With the addition of an appropriate hysteresis circuit of known form the transistor may be used to ground the control electrode to switch off the IBGT 4 when the detected current exceeds the desired limit.

The desired limit is selected relatively simply by selecting the reference current Ir which, because it can be supplied by a component external to the power semiconductor device, can be selected to meet the end user's requirements and need not be set by the power semiconductor device manufacturer.

The output signal 0 of the comparator 12 may be used as an input signal for any suitable form of system control for the power semiconductor device 4. For example, in the example described above, the output signal may be used to switch off the power semiconductor device 4 when an overload causes an excessive current. The circuit may thus be used for current limiting and should assist in inhibiting problems such as avalanche breakdown which might otherwise occur if the current became too high. The circuit could also be used to detect an undercurrent as may for example occur if the load connected to the power semiconductor device becomes open-circuited, for example if the ignition coil fails when the power semiconductor device 4 is being used in an automotive ignition application. Indeed the same circuit may be used to detect both overcurrents and undercurrents by providing two separate current sources providing two different reference currents and by comparing the sensed current separately with each reference current Ir.

As will be appreciated by those skilled in the art, the collector of a pnp bipolar transistor is a high resistance terminal and close to an ideal current source whereas the source of an insulated gate field effect transistor is really a voltage source in series with a resistance equal to 1/gm. The example described above in which the cells of the sense current carrying section 4b consist only of the pup bipolar transistor component of the IGBT 4 therefore has, as indicated above, advantages in that, because the sense current carrying section 4b is formed only by a bipolar component it does not include the resistance of the MOS component and provides a good current source. Moreover, the sense current section 4b is not constrained to the source (emitter) voltage of the IGBT 4 and is not affected by changes in the I-V characteristics of the IGBT such as may occur when the IGBT is being used in an automotive ignition system and the IGBT moves from a state in which the MOS part of the structure is in the linear region to an active state in which the MOS part of the IGBT is saturated.

However, any other suitable form of integrated sense current carrying section which follows and thus provides an indication of the total IGBT current may be used. Thus, the sense current carrying section 4b could consist of one or more cells identical to the active device cells although in such circumstances the problems mentioned above with respect to the effect of the MOS component internal resistance and the fact that the sense current carrying section would be tied to the IGBT source (emitter) voltage would arise. In such circumstances, so as to enable the sense current Is to track the main device current Im more closely, a third resistor R3 similar to the first and second resistors R1 and R2 having a value scaled in inverse proportion to the ratio of the number of cells in the main and sense current carrying sections 4a and 4b may be provided, as shown in phantom lines in FIG. 1, between the second main electrode 7 of the IGBT main current carrying section 4a and the second power supply line 3.

In the examples described above, the current sensing circuit may be integrally formed using a single semiconductor body. Generally, however, the current source 11 especially will be in the form of a separate part. Similarly, although the resistors R1 and R2 (and R3 if present) and the comparator may be formed by an integral component, this component (that is the circuit without the current source 11) may be made up of separate parts, that is with the resistors and comparator formed separately from the IGBT.

Although the present invention has been described above in relation to a vertical IGBT it could be applied to lateral devices. Moreover, the present invention may be applied to cellular power semiconductor devices other than IGBTs. Thus, for example, the power semiconductor device may be a power MOSFET if, in the cross-section shown in FIG. 2, the substrate and common drift region are of the same conductivity type. Also, it is conceivable that the power semiconductor device could be a bipolar transistor. In either case, the sense cells would generally be identical to the active device cells and it would probably be desirable for the third resistor mentioned above to be provided so as to enable the sense current to track the main current more closely because of the fact that the sense current section would be tied to the source (emitter) voltage of the main current carrying section.

Of course the conductivity types given above could be reversed so that the invention may be applied, with appropriate change in voltage polarities, to p-channel or p type devices.

The present invention may also be applied to semiconductor devices other than silicon semiconductor devices.

From reading the present disclosure, other modifications and variations will be apparent to persons skilled in the art. Such modifications and variations may involve other features which are already known in the semiconductor art and which may be used instead of or in addition to features already described herein.

What is claimed is:

1. A power semiconductor device circuit having first and second terminals, and comprising a power semiconductor device having:

a first main electrode coupled to the first terminal;

a second main electrode coupled to the second terminal;

a main current carrying section comprising a number of parallel-connected active device cells between the first and second main electrodes;

a control electrode for controlling the active device cells; and a sense current carrying section between the first main electrode coupled to the first terminal and a second main electrode separate from the second main electrode of the main current carrying section;

the sense current carrying section comprising at least one sense cell similar to the active device cells in that the active device and sense cells each comprise a current path through first, second and third semiconductor regions, of which the first region is contacted by the first main electrode, the third region is a common region of one conductivity type of the cells and separates the first region from a respective second region of each cell, and the second regions are of the opposite conductivity type and are contacted by the respective second main electrode; and wherein the circuit further comprises a current sensing arrangement including:

a first resistor coupling the second main electrode of the sense current carrying section to the second terminal;

a second resistor of the same type as the first resistor;

a current source coupled in series with the second resistor to the second terminal for supplying a reference current through the second resistor; and a comparator for comparing the voltages across the first and second resistors and for providing an output signal to indicate when the current through the main current carrying section reaches a predetermined value.

2. A circuit according to claim 1, wherein the second main electrode of the power semiconductor device is coupled to the second terminal by a third resistor of the same type as the first and second resistors.

3. A circuit according to claim 1, wherein the resistors comprise semiconductor resistors carried by a semiconductor body of the power semiconductor device, within which body the active device cells and the at least one sense cell are formed.

4. A circuit according to claim 3, wherein the resistors comprise thin-film semiconductor resistors provided on and insulated from the power semiconductor device.

5. A circuit according to claim 4, wherein the active device cells comprise an insulated gate transistor, of which the third region is a common drift region of one conductivity type, the second regions are body regions of the opposite conductivity type, and each active device cell has a source region of the one conductivity type separated from the common drift region by its body region and shorted by the second main electrode to the body region, which body region defines a conduction channel area between the source region and the common drift region, and an insulated gate is provided adjacent the channel area to form the control electrode for providing a gateable conductive path for charge carriers of the one conductivity type between the source region and the common drift region.

6. A circuit according to claim 1, wherein the power semiconductor device is an insulated gate bipolar transistor.

7. A power semiconductor device circuit having first and second terminals, and comprising an insulated gate bipolar transistor having:

a first main electrode coupled to the first terminal;

a second main electrode coupled to the second terminal;

a main current carrying section comprising a number of parallel-connected active device cells formed in a semiconductor body between the first and second main electrodes;

a control electrode for controlling the active device cells;

each active device cell comprising an emitter region of one conductivity type, a body region of the opposite conductivity type within a common drift region of the one conductivity type of the cells and separating the emitter region from the common drift region, the emitter region being shorted by the second main electrode to the body region, which body region defines a conduction channel area between the emitter region and the common drift region, adjacent which channel area there is provided an insulated gate to form the control electrode for providing a gateable conductive path for charge carriers of the one conductivity type between the emitter region and the common drift region, and at least one injector region contacting the first main electrode for injecting charge carriers of the opposite conductivity type into the common drift region; and a sense current carrying section formed in the semiconductor body between the first main electrode coupled to the first terminal and a second main electrode which is separate from the second main electrode of the main current carrying section;

the sense current carrying section comprising at least one sense cell similar to the active device cells in that the sense cell comprises a body region of the opposite conductivity type within an area of the common drift region of one conductivity type, which body region of the sense cell is contacted by the second main electrode of the sense current carrying section; and wherein the circuit further comprises a current sensing arrangement including:

a first resistor coupling the second main electrode of the sense current carrying section to the second terminal;

a second resistor of the same type as the first resistor;

a current source coupled in series with the second resistor to the second terminal for supplying a reference current through the second resistor; and a comparator for comparing the voltages across the first and second resistors and for providing an output signal to indicate when the current through the main current carrying section reaches a predetermined value.

8. A circuit according to claim 7, wherein the at least one sense cell comprises a body region structurally similar to the body regions of the active device cells but from which the emitter region has been omitted, and the first main electrode of the sense current carrying section is provided by the first main electrode of the main current carrying section.

9. A circuit according to claim 7, wherein the power semiconductor device comprises a vertical device with the first and second main electrodes of the main current carrying section being provided at opposed major surfaces of the semiconductor body.

10. A circuit according to claim 7, wherein the resistors comprise thin-film semiconductor resistors provided on and insulated from the power semiconductor device.

11. A circuit component comprising a power semiconductor device having:

a first main electrode for coupling to a first supply line;

a second main electrode for coupling to a second supply line;

a main current carrying section comprising a number of parallel-connected active device cells between the first and second main electrodes;

a control electrode for controlling the active device cells; and a sense current carrying section between the first main electrode for coupling to the first supply line and a second main electrode separate from the second main electrode of the main current carrying section;

the sense current carrying section comprising at least one sense cell similar to the active device cells in that the active device and sense cells each comprise a current path through first, second and third semiconductor regions, of which the first region is contacted by the first electrode, the third region is a common region of one conductivity type of the cells and separates the first region from a respective second region of each cell, and the second regions are of the opposite conductivity type and are contacted by the respective second main electrode; and wherein the circuit component further comprises a current sensing arrangement including:

a first resistor for coupling the second main electrode of the sense current carrying section to the second supply line;

a second resistor of the same type as the first resistor for coupling in series with a current source and to the second supply line for supplying a reference current through the second resistor; and a comparator for comparing the voltages across the first and second resistors and for providing an output signal to indicate when the current through the main current carrying section reaches a predetermined value.

12. A circuit component according to claim 11 and further comprising a current source for connection to the second power supply line via the second resistor.

13. A power semiconductor device circuit having first and second terminals, and comprising a power semiconductor device having:

a first main electrode coupled to the first terminal;

a second main electrode coupled to the second terminal;

a main current carrying section comprising an active device cell between the first and second main electrodes;

a control electrode for controlling the active device cells; and a sense current carrying section between the first main electrode coupled to the first terminal and a second main electrode separate from the second main electrode of the main current carrying section;

the sense current carrying section comprising a sense cell similar to the active device cell in that the active device and sense cells each comprise a current path through first, second and third semiconductor regions, of which the first region is contacted by the first main electrode, the third region is a common region of one conductivity type of the cells and separates the first region from a respective second region of each cell, and the second regions are of the opposite conductivity type and are contacted by the respective second main electrode; and wherein the circuit further comprises a current sensing arrangement including:

a first resistor coupling the second main electrode of the sense current carrying section to the second terminal;

a second resistor of the same type as the first resistor;

a current source coupled in series with the second resistor to the second terminal for supplying a reference current through the second resistor; and a comparator for comparing the voltages across the first and second resistors and for providing an output signal to indicate when the current through the main current carrying section reaches a predetermined value.

* * * * *